United States Patent
Yeo et al.

(10) Patent No.: US 6,617,667 B2
(45) Date of Patent: Sep. 9, 2003

(54) OPTICAL DEVICE CARRIER

(75) Inventors: Mui Seng Yeo, Singapore (SG); Yong Kee Yeo, Singapore (SG); Mahadevan K. Iyer, Singapore (SG); Eitaro Ishimura, Tokyo (JP); Gou Sakaino, Tokyo (JP)

(73) Assignees: Mitsubishi Denki Kabushiki Kaisha, Tokyo (JP); Institute of Microelectronics (SG)

( * ) Notice: Subject to any disclaimer, the term of this patent is extended or adjusted under 35 U.S.C. 154(b) by 0 days.

(21) Appl. No.: 09/988,692

(22) Filed: Nov. 20, 2001

(65) Prior Publication Data

US 2003/0052380 A1 Mar. 20, 2003

(30) Foreign Application Priority Data

Sep. 17, 2001 (SG) ........................... 200105652-2

(51) Int. Cl.$^7$ .............................................. H01L 29/00
(52) U.S. Cl. .................. 257/536; 257/448; 257/459; 257/503; 257/773; 257/784
(58) Field of Search .................. 257/503, 536, 257/773, 784, 448, 459

(56) References Cited

U.S. PATENT DOCUMENTS

| | | | | |
|---|---|---|---|---|
| 6,008,534 A | * | 12/1999 | Fulcher | 257/691 |
| 6,215,372 B1 | * | 4/2001 | Novak | 333/12 |
| 6,384,485 B1 | * | 5/2002 | Matsushima | 257/778 |
| 6,392,294 B1 | * | 5/2002 | Yamaguchi | 257/690 |
| 6,521,990 B2 | * | 2/2003 | Roh et al. | 257/706 |
| 2002/0186168 A1 | * | 12/2002 | Cheah | 343/700 MS |

FOREIGN PATENT DOCUMENTS

JP          04010295 A * 1/1992 ............ G11C/5/00

OTHER PUBLICATIONS

Noboru Iwasaki et al.,*Packaging Technology for 40Gb/s Optical Receiver Module with an MU–Connector Interface*, IEEE Transactions On Advanced Packaging, vol. 24, No. 4, Nov. 2001, pp. 429–433.

* cited by examiner

*Primary Examiner*—Eddie Lee
*Assistant Examiner*—Matthew E. Warren
(74) *Attorney, Agent, or Firm*—Conley Rose, P.C.

(57) ABSTRACT

A layout of a carrier in an optical component having the carrier and an optical device is described. The layout comprises a pair of terminals, a resistor connected to a first terminal, a wire bond connected in series with the resistor for connecting the resistor to an optical device, and a first ground patch connected to a second terminal and for connecting to an optical device for providing a common ground on a first surface on a substrate on which the carrier is based, whereby the pair of terminals, the resistor, the wire bond and an optical device form an optical signal transmission system in the optical component. In the layout, an optical device is disposable on a first edge of the first ground patch which forms a substantially geometric pattern on the carrier, and the first terminal is connected to the resistor through a conductor which in combination with the resistor forms a first substantially elongated pattern on the carrier that is disposed adjacent and longitudinally orthogonal to the first edge of the first ground patch. Also in the layout, the second terminal is connected to the first ground patch through a conductor that forms a second substantially elongated pattern on the carrier that is spaced apart from and substantially longitudinally parallel to the first substantially elongated pattern, and the second terminal is connected to the first ground patch through a first via that connects to a second ground patch on a different layer in the substrate which in turn is connected to the first ground patch through a second via.

20 Claims, 4 Drawing Sheets

OPTICAL DEVICE CARRIER

INVENTION FIELD

The invention relates generally to optical devices. In particular, the invention relates to the design of carriers for optical devices.

BACKGROUND

In the electronics and photonics industry, optical components are usually assembled using a number of sub-components, including optical devices such as optical sources and detectors, and carriers for these optical devices. Typically, there are large electrical parasitic capacitances inherent in the carriers, which are structures having conductive patterns as interconnects. The design of the carrier, in particular the layout of the conductive pattern, is one possible reason for the existence of parasitic capacitance.

When an optical component is assembled, an optical device is mounted on and connected to a carrier using a wire bond as interconnect. During high frequency operations, the wire bond becomes predominantly inductive. With the combination of parasitic capacitance due to the layout of the carrier, the inductance in the wire bond and any inherent stray capacitance in the optical device, an LC resonant circuit is inadvertently formed in the optical device. At high frequency operations during which signals are transmitted at high data rates through the optical device, the presence of the LC resonant circuit causes considerable distortion to the signals in the optical device. Hence, design optimization of the carrier is needed to improve the performance.

One example of an optical device is shown in FIG. 1, which consists of an optical source such as a laser diode LD mounted on a carrier. The carrier includes a pair of input terminals T1 and T2, and an input-matching resistor RES and a wire bond WB connected in series, the resistor RES and wire bond WB connecting the input terminal T1 to an input of the laser diode LD. The pair of input terminals T1 and T2 provides an interface through which input is provided to the optical device, whereby a signal received at the input terminal T1 is transmitted first to the resistor RES and then to the laser diode LD, the signal reference of the signal being connected to the optical device ground GND to which the terminal T2 and a laser diode LD reference is connected. A pair of nodes N1 and N2 on the carrier form the physical locations on the layout at which the wire bond WB is connected to the resistor RES and the input of the laser diode LD, respectively. A test pad TP is also connected to the node N1 for allowing the laser diode LD to be tested for integrity after assembly, in which a parasitic capacitance P_CAP is formed between the connection to the test pad TP and the ground GND. Stray capacitance LD_CAP inherent in the laser diode LD is also formed between both terminals of the laser diode LD.

A conventional layout of the carrier with the laser diode LD mounted thereon is shown in plan and cross sectional side views in FIGS. 2A and 2B, respectively. The carrier is structurally based on a substrate SUB and includes the resistor RES and conductors for allowing signal transmission and forming the ground GND for signal referencing. The conductors and resistor RES are etched and laid onto the substrate to form a pattern.

The laser diode LD is mounted on a first ground patch GND1 which is geometrically shaped like a horizontally mirrored L and patterned on the upper planar surface of the substrate SUB, the size of which is substantially large in relation to the real estate of the carrier so as to provide the laser diode LD with a heat sink for dissipating any heat generated by the laser diode LD. The laser diode LD is also connected to the first ground patch GND1 at the mounting positions for connecting the laser diode LD reference to the first ground patch GND1.

The pair of input terminals T1 and T2 is disposed along the edge of the carrier, whereby the input terminal T1 forms an extremity of an elongated conductor that is connected to the resistor RES at the other extremity. The resistor RES is in turn connected to a conductor patch forming the node N1, to which one extremity of the wire bond WB is connected and from which a test pad conductor TPC extends to connect the test pad TP to the node N1. The other extremity of the wire bond WB is connected directly to the laser diode LD at the laser diode LD input found on top of the laser diode LD.

The test pad TP is disposed adjacent to the neck and shoulder of the first ground patch GND1 and the test pad conductor TPC is typically routed close to an edge of the first ground patch GND1 because this route affords the shortest distance to the test pad TP. By doing this however, the parasitic capacitance P_CAP is formed between the test pad conductor TPC and the first ground patch GND1, which inadvertently contributes to the formation of the LC resonant circuit.

The input terminal T2 is an input ground patch which is connected to a second ground patch GND2 patterned on the lower planar surface on the substrate SUB through a via V1. The second ground patch GND2 may also be patterned on a different layer in the substrate SUB. The input terminal T2 is isolated from the first ground patch GND1 on the upper planar surface of the substrate SUB but is connected to the first ground patch GND1 through the via V1 to the second ground patch GND2, which in turn is connected to the first ground patch GND1 through a number of vias V2, V3 and V4 evenly spaced out on the first ground patch GND1.

Frequency responses of the carrier as transmission means obtained both by measurement and software simulation are shown in graphs in FIG. 3. Both results show a high degree of consistency in that at the operating frequency of 15 GHz, the discrepancy between the insertion losses of the carrier by measurement and simulation is approximately 0.9 dB.

When the laser diode LD is mounted on the carrier, the frequency response of the optical device as transmission means is also obtained and shown as a graph in FIG. 4. At the operating frequency of 15.5 GHz, the graph shows that there is a resonant peak in the frequency response, which means that signals transmitted through the optical component are distorted when emitted by the laser diode LD. The existence of the resonant peak is a result of the contribution from the parasitic capacitance P_CAP, inductance in the wire bond WB, and the inherent stray capacitance LD_CAP in the laser diode LD.

It is therefore clear from the foregoing that there is a need for conventional designs of optical device carriers to be improved so that insertion loss and resonant peaks at high frequencies may be alleviated.

SUMMARY

In accordance with an aspect of the invention, there is described hereinafter in an optical component having a carrier and an optical device, a layout of the carrier. The layout comprises a pair of terminals, a resistor connected to a first terminal, a wire bond connected in series with the resistor for connecting the resistor to an optical device, and a first ground patch connected to a second terminal and for connecting to an optical device for providing a common ground on a first surface on a substrate on which the carrier is based, whereby the pair of terminals, the resistor, the wire bond and an optical device form an optical signal transmission system in the optical component. In the layout, an optical device is disposable on a first edge of the first ground patch which forms a substantially geometric pattern on the carrier, and the first terminal is connected to the resistor through a conductor which in combination with the resistor forms a first substantially elongated pattern on the carrier that is disposed adjacent and longitudinally orthogonal to the first edge of the first ground patch. Also in the layout, the second terminal is connected to the first ground patch through a conductor that forms a second substantially elongated pattern on the carrier that is spaced apart from and substantially longitudinally parallel to the first substantially elongated pattern, and the second terminal is connected to the first ground patch through a first via that connects to a second ground patch on a different layer in the substrate which in turn is connected to the first ground patch through a second via.

In accordance with a second aspect of the invention, there is described in an optical component having a carrier and an optical device, a method for designing the layout of the carrier. The method comprising the steps of providing a pair of terminals, connecting a resistor to a first terminal, connecting a wire bond in series with the resistor for connecting the resistor to an optical device, and connecting a first ground patch to a second terminal and an optical device for providing a common ground on a first surface on a substrate on which the carrier is based, whereby the pair of terminals, the resistor, the wire bond and an optical device form an optical signal transmission system in the optical component. In the layout, an optical device is disposable on a first edge of the first ground patch which forms a substantially geometric pattern on the carrier, and the first terminal is connected to the resistor through a conductor which in combination with the resistor forms a first substantially elongated pattern on the carrier that is disposed adjacent and longitudinally orthogonal to the first edge of the first ground patch. Also in the layout, the second terminal is connected to the first ground patch through a conductor that forms a second substantially elongated pattern on the carrier that is spaced apart from and substantially longitudinally parallel to the first substantially elongated pattern, and the second terminal is connected to the first ground patch through a first via that connects to a second ground patch on a different layer in the substrate which in turn is connected to the first ground patch through a second via.

BRIEF DESCRIPTION OF DRAWINGS

Embodiments of the invention are described hereinafter with reference to the drawings, in which.

INVENTION DESCRIPTION

The need for conventional designs of optical device carriers to be improved so that insertion loss and resonant peaks at high frequencies may be alleviated is addressed by optimized layouts according to embodiments of the invention described hereinafter. The optimizations are achieved by redesigning the signal flow paths on the carriers, so that parasitic capacitances of the carriers are reduced.

With such optimized designs, the carriers may be used for 10-Gigabit rate data transmissions with less signal distortion.

Figure 1:
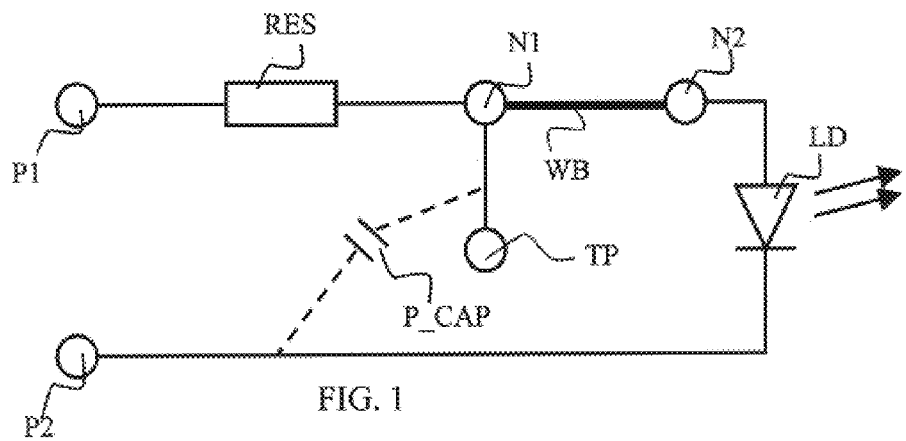
FIG. 1 is a circuit diagram of an optical device.
Figure 3:
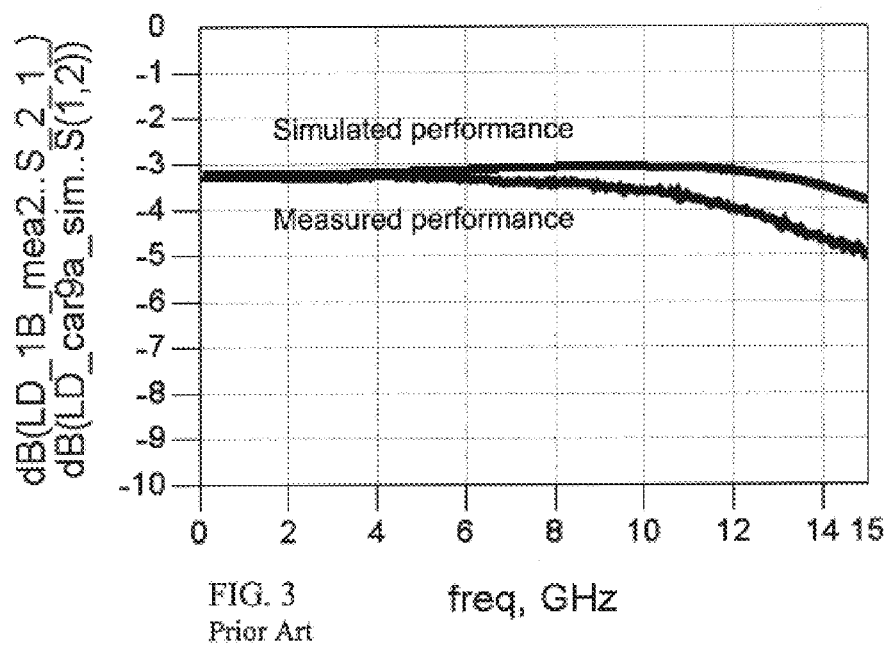
FIG. 3 shows graphs relating to frequency responses of the layout of the carrier of FIGS. 2A and 2B.
Figure 4:
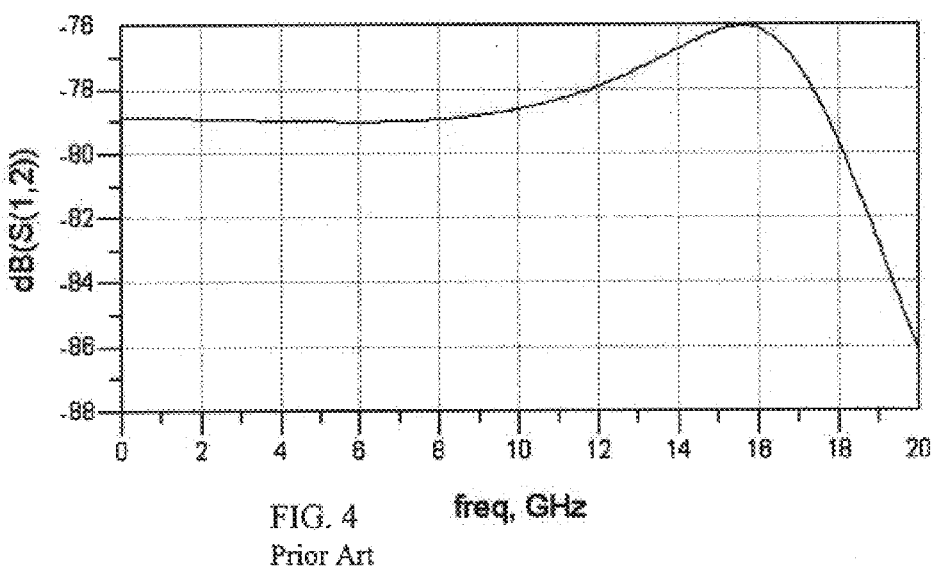
FIG. 4 shows a graph relating to the frequency response of the optical device with a laser diode mounted on the carrier of FIGS. 2A and 2B.
Figures 2A, 2B:
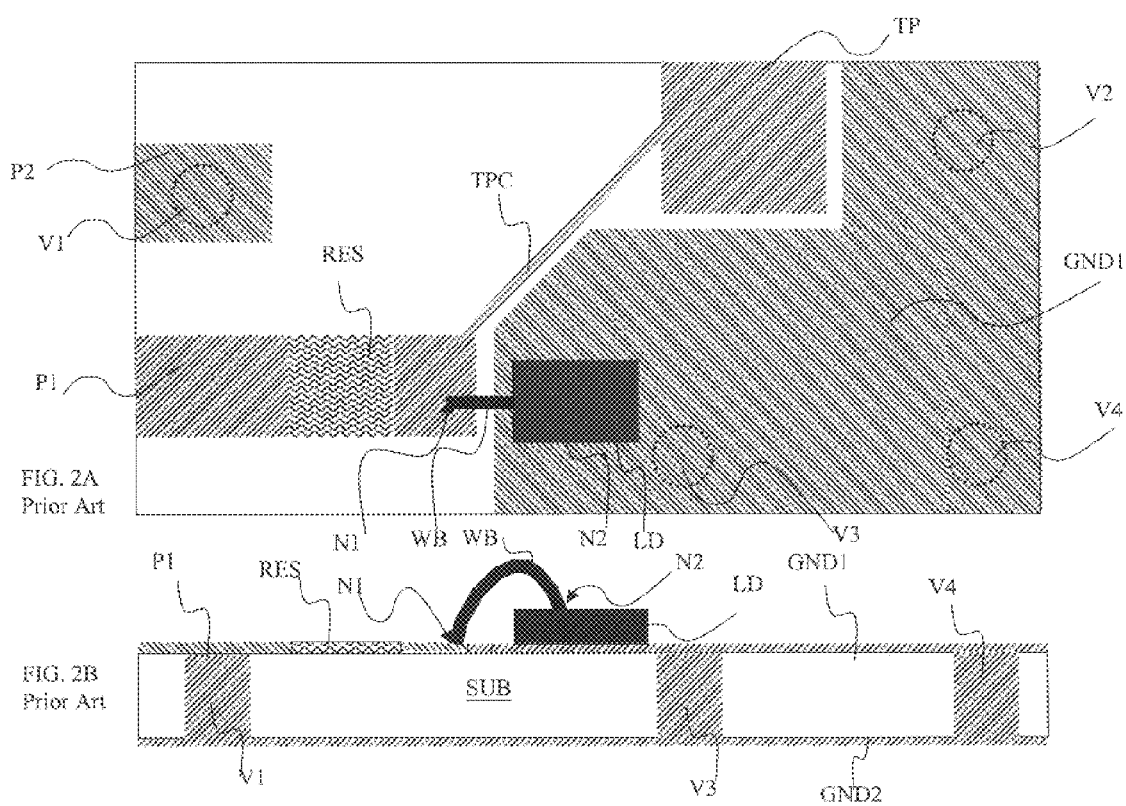
FIGS. 2A and 2B are plan and side cross-sectional views of a conventional layout of a carrier in the optical device of FIG. 1.
Figures 5A, 5B:
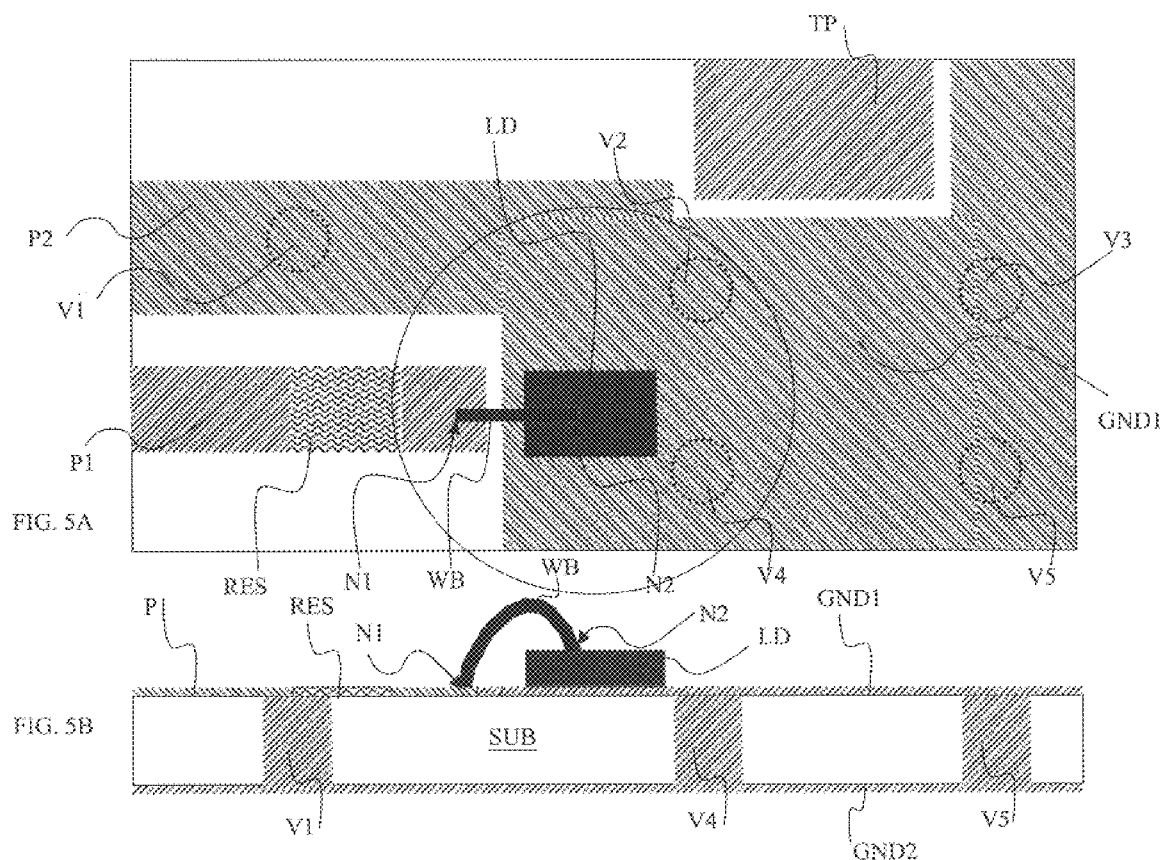
FIGS. 5A and 5B are plan and side cross-sectional views of a layout of the carrier in the optical device of FIG. 1 according to an embodiment of the invention.

Embodiments of the invention are described hereinafter with reference to the optical device of FIG. 1, the optical device including an optical component and carrier therefor. A layout of the carrier with a laser diode LD mounted thereon according to an embodiment of the invention is shown in plan and cross sectional side views in FIGS. 5A and 5B, respectively. The carrier is structurally based on a substrate SUB and includes a resistor RES and conductors for allowing signal transmission and forming the ground GND for signal referencing. The conductors and resistor RES are etched and laid onto the substrate to form a pattern. Preferably, the resistor RES value ranges from 40 to 60 ohms.

The laser diode LD is mounted on a first ground patch GND1 which is generally rectangle in shape and patterned on the upper planar surface of the substrate SUB, the size of which is substantially large in relation to the real estate of the carrier so as to provide the laser diode LD with a heat sink for dissipating any heat generated by the laser diode LD. The laser diode LD is also connected to the first ground patch GND1 at the mounting positions for connecting the laser diode LD reference to the first ground patch GND1. The laser diode LD is disposed on an edge of the first ground patch GND1.

The pair of input terminals T1 and T2 is disposed along the edge of the carrier, whereby the input terminal T1 forms an extremity of an elongated conductor that is connected to the resistor RES at the other extremity of the elongated conductor. The resistor RES is in turn connected to a conductor patch forming the node N1, to which one extremity of the wire bond WB is connected. The other extremity of the wire bond WB is connected directly to the laser diode LD at the laser diode LD input found on top of the laser diode LD. The input terminal T1, resistor RES and node N1 are aligned to form a rectangular pattern that is disposed adjacent to the edge of the first ground patch GND1 on which the laser diode LD is disposed. The rectangular pattern is also longitudinally orthogonal to the edge of the first ground patch GND1.

To the node N1 and the test pad TP a test wire bond (not shown) is also connected for connecting the node N1 to a test pad TP. The test wire bond is removed after test on the integrity of the laser diode is carried out pursuant to assembly.

The test pad TP is disposed adjacent to an edge of the first ground patch GND1 that is in turn adjacent to the edge of the first ground patch GND1 on which the laser diode LD is disposed. Since the test wire bond is used to temporarily connect the node N1 to the test pad TP during testing and is removed after testing, the problem of parasitic capacitance P_CAP due to the permanent presence of a test pad conductor that inadvertently contributes to the formation of the LC resonant circuit is alleviated.

The input terminal T2 forms one extremity of an elongated input ground patch that is connected to the first ground patch GND1 at the other extremity on the upper planar surface of the substrate SUB. The elongated input ground patch is a strip of conductor which is longitudinally parallel to the rectangular pattern consisting of the input terminal T1, resistor RES and node N1. Preferably, the spacing between the elongated input ground patch and the rectangular pattern ranges from 0.10 mm to 0.2 mm. Also, the width of the rectangular pattern preferably ranges from 0.15 mm to 0.3 mm. Further, the width of the elongated input ground patch preferably ranges from 0.16 mm onwards. Still further, the combined lengths of adjacent edges of the rectangular pattern adjacent to the elongated input ground patch and the first ground patch GND1 is preferably less than or equal to 2 mm.

The input terminal T2 is also connected to the first ground patch GND1 through a via V1 to a second ground patch GND2 on a different layer in the substrate SUB, such as on the other planar surface on the substrate SUB, which in turn is connected to the first ground patch GND1 through a number of vias V2, V3, V4 and V5 evenly spaced out on the first ground patch GND1. At least one of the vias V2, V3, V4 or V5 is preferably disposed within a circle of radius 0.48 mm from the centre of the laser diode LD.

Figure 6:
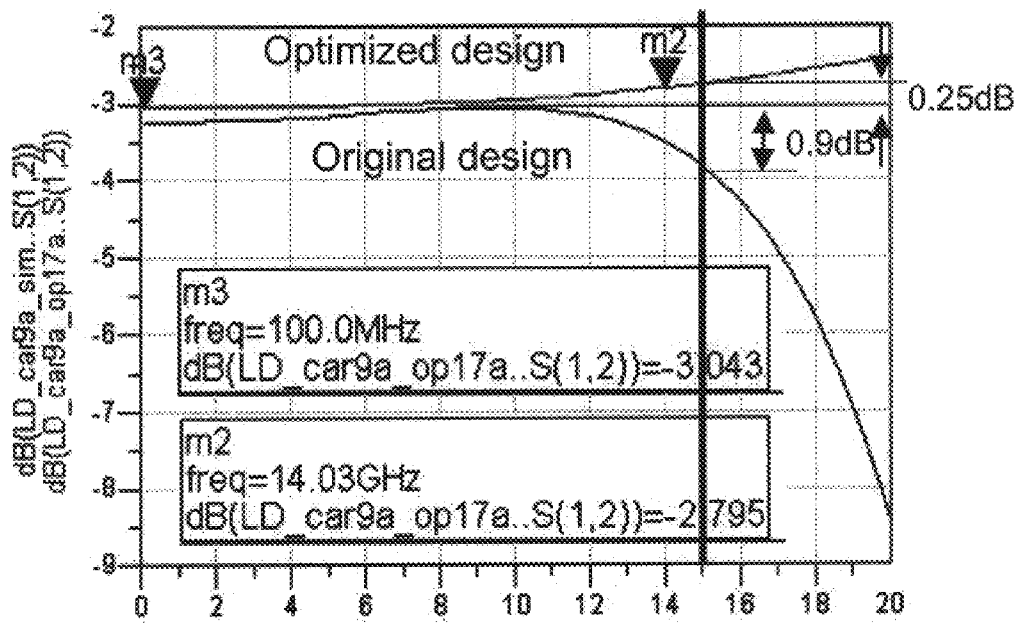
FIG. 6 shows graphs relating to frequency responses of the layout of the carrier of FIGS. 5A and 5B.

Frequency responses of the carrier as transmission means obtained for a conventional layout and the optimised layout are shown in graphs in FIG. 6. Both results show a discrepancy in that at the operating frequency of 15 GHz, the insertion loss of the carrier having the conventional layout is approximately −0.9 dB, while the insertion loss of the carrier having the optimised layout is approximately +0.25 dB.

Figure 7:
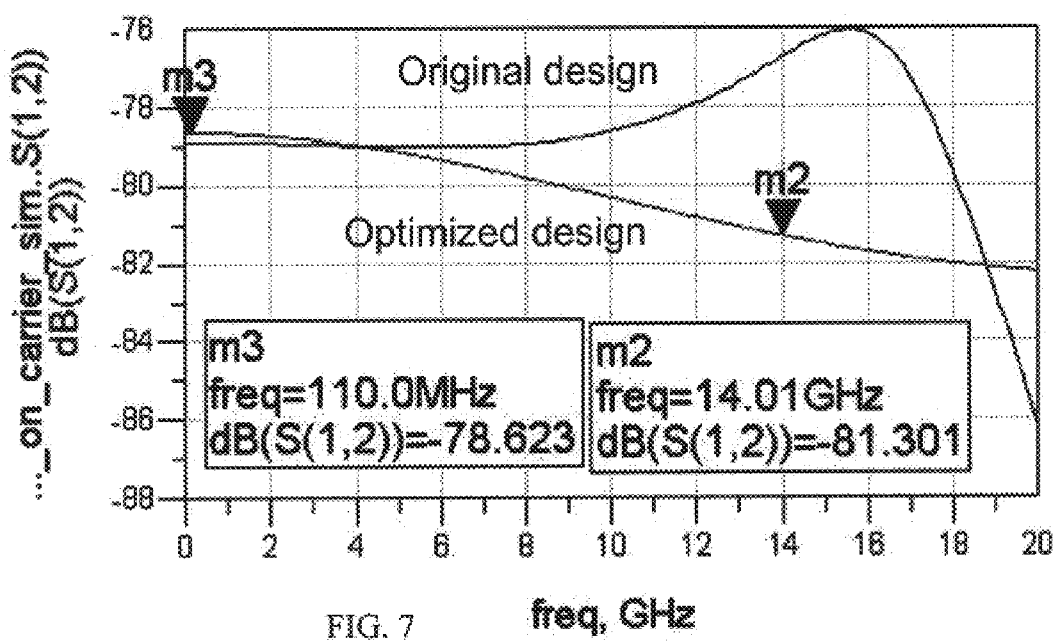
FIG. 7 shows a graph relating to the frequency response of the optical device with the laser diode mounted on the carrier of FIGS. 5A and 5B.

When the laser diode LD is mounted on the carrier, the frequency response of the optical device as transmission means is also obtained and shown as a graph in FIG. 7. At the operating frequency of 15.5 GHz, the graph shows that there is no longer a resonant peak in the frequency response, which means that signals transmitted through the optical component are not distorted when emitted by the laser diode LD.

In addition to the alleviation of the resonant peaks and insertion losses at high frequency operations, because of the optimised layout of the carrier, the carrier may advantageously be manufactured with greater ease than conventional designs of optical device carriers. Furthermore, the implementation of such an optimised layout is also more cost effective, therefore providing for a low cost optical device carrier.

In the foregoing manner, there are described optimised layouts of carriers for optical devices according to embodiments of the invention for addressing the need for conventional designs of optical device carriers to be improved so that insertion loss and resonant peaks at high frequencies may be alleviated. Although only a number of embodiments of the invention are disclosed, it may become apparent to one skilled in the art in view of this disclosure that numerous changes and/or modification can be made without departing from the scope and spirit of the invention.

What is claimed is:

1. In an optical component having a carrier and an optical device, a layout of the carrier comprising:
    a pair of terminals;
    a resistor connected to a first terminal;
    a wire bond connected in series with the resistor for connecting the resistor to an optical device; and
    a first ground patch connected to a second terminal and for connecting to an optical device for providing a common ground on a first surface on a substrate on which the carrier is based
    whereby the pair of terminals, the resistor, the wire bond and an optical device form an optical signal transmission system in the optical component
    wherein a first edge of the first ground patch is configured to receive an optical device, the first ground patch forming a substantially geometric pattern on the carrier;
    wherein the first terminal is connected to the resistor through a conductor which in combination with the resistor forms a first substantially elongated pattern on the carrier that is disposed adjacent and longitudinally orthogonal to the first edge of the first ground patch
    wherein the second terminal is connected to the first ground patch through a conductor that forms a second substantially elongated pattern on the carrier that is spaced apart from and substantially longitudinally parallel to the first substantially elongated pattern
    wherein the second terminal is connected to the first ground patch through a first via that connects to a second ground patch on a different layer in the substrate which in turn is connected to the first ground patch through a second via.

2. The layout as in claim 1, wherein the width of the spacing between the first and second substantially elongated patterns ranges between 0.10 to 0.2 mm.

3. The layout as in claim 2, wherein the resistor value ranges between 40 to 60 ohms.

4. The layout as in claim 3, wherein the width of the first substantially elongated pattern ranges between 0.15 to 0.3 mm.

5. The layout as in claim 4, wherein the length of adjacent edges of the first substantially elongated pattern adjacent to the second substantially elongated pattern and the first edge of the first ground patch is less than or equal to 2 mm.

6. The layout as in claim 5, wherein the second via is disposed on the first ground patch within a circle of radius 0.48 mm from the centre of an optical device disposed on the first ground patch.

7. The layout as in claim 6, wherein the width of the second substantially elongated pattern is greater than 0.16 mm.

8. The layout as in claim 7, wherein the first substantially elongated pattern is substantially rectangular in shape.

9. The layout as in claim 7, wherein the second substantially elongated pattern forms a strip.

10. The layout as in claim 7, wherein the second ground patch is formed on a second surface on the substrate.

11. In an optical component having a carrier and an optical device, a method for designing the layout of the carrier, the method comprising the steps of:
    providing a pair of terminals;
    connecting a resistor to a first terminal;
    connecting a wire bond in series with the resistor for connecting the resistor to an optical device; and
    connecting a first ground patch to a second terminal and an optical device for providing a common ground on a first surface on a substrate on which the carrier is based
    whereby the pair of terminals, the resistor, the wire bond and an optical device form an optical signal transmission system in the optical component
    wherein a first edge of the first ground patch is configured to receive an optical device, the first ground patch forming a substantially geometric pattern on the carrier;

wherein the first terminal is connected to the resistor through a conductor which in combination with the resistor forms a first substantially elongated pattern on the carrier that is disposed adjacent and longitudinally orthogonal to the first edge of the first ground patch wherein the second terminal is connected to the first ground patch through a conductor that forms a second substantially elongated pattern on the carrier that is spaced apart from and substantially longitudinally parallel to the first substantially elongated pattern wherein the second terminal is connected to the first ground patch through a first via that connects to a second ground patch on a different layer in the substrate which in turn is connected to the first ground patch through a second via.

12. The method as in claim 11, wherein the width of the spacing between the first and second substantially elongated patterns ranges between 0.10 to 0.2 mm.

13. The method as in claim 12, wherein the resistor value ranges between 40 to 60 ohms.

14. The method as in claim 13, wherein the width of the first substantially elongated pattern ranges between 0.15 to 0.3 mm.

15. The method as in claim 14, wherein the length of adjacent edges of the first substantially elongated pattern adjacent to the second substantially elongated pattern and the first edge of the first ground patch is less than or equal to 2 mm.

16. The method as in claim 15, wherein the second via is disposed on the first ground patch within a circle of radius 0.48 mm from the centre of an optical device disposed on the first ground patch.

17. The method as in claim 16, wherein the width of the second substantially elongated pattern is greater than 0.16 mm.

18. The method as in claim 17, wherein the first substantially elongated pattern is substantially rectangular in shape.

19. The method as in claim 17, wherein the second substantially elongated pattern forms a strip.

20. The method as in claim 17, wherein the second ground patch is formed on a second surface on the substrate.

* * * * *